United States Patent
Kobayashi et al.

(10) Patent No.: US 8,025,734 B2
(45) Date of Patent: Sep. 27, 2011

(54) METHOD FOR CONTROLLING THE VOLUME OF A MOLECULAR BEAM

(75) Inventors: Osamu Kobayashi, Ibasaki-ken (JP); Toshihiko Ishida, Ibaraki-ken (JP)

(73) Assignee: Choshu Industry Co., Ltd., Sanyoonoda-shi (JP)

( * ) Notice: Subject to any disclaimer, the term of this patent is extended or adjusted under 35 U.S.C. 154(b) by 0 days.

(21) Appl. No.: 12/658,024

(22) Filed: Feb. 1, 2010

(65) Prior Publication Data

US 2010/0170434 A1 Jul. 8, 2010

Related U.S. Application Data

(62) Division of application No. 11/401,035, filed on Apr. 10, 2006, now Pat. No. 7,682,670.

(30) Foreign Application Priority Data

Nov. 1, 2005 (JP) .................................. 2005-318172

(51) Int. Cl.
C23C 16/00 (2006.01)

(52) U.S. Cl. ...................................................... 118/726

(58) Field of Classification Search ................... 118/726
See application file for complete search history.

(56) References Cited

U.S. PATENT DOCUMENTS 5,336,324 A * 8/1994 Stall et al. ..................... 118/719
2005/0011443 A1 * 1/2005 Matsukaze et al. ........... 118/715

* cited by examiner

*Primary Examiner* — Keath Chen
(74) *Attorney, Agent, or Firm* — Flynn, Thiel, Boutell & Tanis, P.C.

(57) ABSTRACT

A molecular beam source for use in thin-film accumulation, which enables the adjustment of the volume of a molecular beam, which is discharged per hour by using a needle valve, to be constant irrespective of a decrease in a thin-film element-forming material remaining within a crucible, contains heaters 32 and 42 for heating the thin-film element-forming materials "a" and "b" within crucibles 31 and 41, and valves 33 and 43 for adjusting the volumes to be discharged of molecules of the thin-film element forming materials "a" and "b", which are generated within the crucibles 31 and 41. It further contains a controller for adjusting the opening of the valves 33 and 43 by servomotors 36 and 46 through feeding back information relating to the volumes of the molecular beams.

2 Claims, 5 Drawing Sheets (a)

(b)

METHOD FOR CONTROLLING THE VOLUME OF A MOLECULAR BEAM

This application is a divisional of prior U.S. application Ser. No. 11/401,035, filed Apr. 10, 2006 now U.S. Pat. No. 7,682,670.

BACKGROUND OF THE INVENTION

The present invention relates to a molecular beam source used for thin-film accumulation or deposition and a method for controlling the amount or volume of a molecular beam, through heating a material to be formed on a film-forming surface of a solid body or matter, such as, a substrate, etc., in the form of a thin-film, by melting, sublimating or evaporating material(s) for forming a thin-film element, i.e., generating evaporated molecules for growing the thin-film(s) upon the surface of the solid body, and it relates, in particular, to a molecular beam source for use in thin-film accumulation, and is suitable for accumulating or depositing an organic thin-film upon a film-forming surface of the solid body, such as, the substrate, etc., continuously for a long time, and a method for controlling an amount or volume of the molecular beam therefrom.

A thin-film deposition apparatus, called a "molecular beam epitaxy apparatus", comprises a decompressable vacuum chamber, into which a substrate, such as a semiconductor wafer, etc., can be mounted under a high vacuum condition, and heated up to a desired temperature, while providing a molecule supply source cell, such as a Knudsen cell, etc., for example, opposing the film-forming surface thereof. Thus, a material for forming a thin-film element (hereinafter, a thin-film element-forming material), which is put into a crucible of the molecule supply source cell, is heated by means of a heater, to be sublimated, melted or evaporated, so that a molecular beam generated thereby is incident upon the film-forming surface of the substrate, i.e., bringing about the epitaxial growth of the molecules of the thin-film element-forming material on the film-forming surface, thereby forming a film of the thin-film element-forming material.

Such a molecular beam source cell, to be applied in a thin-film deposition or accumulation apparatus, has a crucible made of a material such as PBN (Pyrolithic Boron Nitride), etc., for example, and is highly stable, thermally as well as chemically, so as to receive the thin-film element-forming material therein, and an electric heater is provided surrounding the outside of the crucible to heat the thin-film element-forming material therein, i.e., generating the molecules thereof through sublimation, melting or evaporation of the thin-film element-forming material.

In recent years, attention has been paid to an organic thin-film element, such as, an organic electroluminescence (EL) and/or an organic semiconductor, for example, representatively. Those thin-film elements can be obtained, i.e., the thin-film element-forming material is heated within the vacuum, so as to blast the vapor thereof upon the surface of the substrate, and then it is cooled down to be solidified and bonded thereon. In general, the following method is applied, i.e., the thin-film element-forming material is put into the crucible, which is made of an inorganic material such as PBN, etc., or a material having a high melting-point, such as tungsten, etc., and then the material to be formed as a film is heated by the heater provided around the crucible, thereby generating the vapor thereof to be blasted onto the substrate.

An organic electroluminescence (EL) material, being a representative example of an organic thin-film element, is an element for forming a luminous layer from an organic low-molecular material or an organic high-molecular material, which has EL luminous ability, and attention is paid to, in particular, the characteristics thereof, i.e., as an element of the self-luminous type. In the basic structures thereof, for example, on a film of a hole transportation material, such as triphenyl diamine (TPD) or the like, formed on a hole injection electrode, is laminated or deposited a fluorescent material such as aluminuin-quinolinol complex ($Alq_3$), etc., as the luminous layer and, further thereon is formed an electrode of a metal having a small work function, such as Mg, Li, or Cs, etc., as an electron-injection electrode. However, the materials of the thin-film elements are expensive, in general.

By the way, when building up the thin-film elements, there is also the necessity of the time for exchanging the substrates, on the surfaces of which the thin film should be formed, and for adjusting the position of a mask for blasting the material only onto necessary portions thereof, etc. However, since many of the materials for the organic thin-film element as was mentioned above is sublimated or evaporated at relatively low temperatures, the material is evaporated, even during the time of exchanging the substrates and/or aligning the position of the mask, etc., i.e., there is a drawback that the very expensive material is wasted, uselessly.

Then, as is described in the following Patent Document 1, which will be mentioned below, there is proposed a molecule supply source for use in thin-film deposition of receiving the crucibles therein, each of which is hermetically sealed or closed in the structure, wherein a molecule discharge passage is provided for directing the molecules of the thin-film element material, which are generated within the crucibles, towards the film-forming surface, and further comprising a needle valve for adjusting an amount or volume of molecular supply in the molecule discharge passage.

With the molecule supply source for use in thin-film deposition comprising such the valve mechanism, it is possible to cut or shut off the discharge of the vapor of the material for the thin-film element, which is generated within the crucible, by means of the valve, and in addition thereto, to adjust the amount or volume of the molecular supply by means of the needle valve, as well. For the purpose of forming the thin-film while maintaining a constant film-thickness and quality thereof, it is effective to keep the volume of the molecular supply constant per hour, which is discharged from the molecular supply source.

As a representative material for the organic thin-film elements mentioned above, there is already known a material of the EL thin-film element, and many of these materials for forming thin-film elements are granulated or powdered, and they are put into the crucibles in that condition. Thus, with the heating of it within the crucible by means of the heater, which is provided outside the crucible, the material of the EL thin-film element is heated and sublimated, and is evaporated to be discharged towards the substrate, and thereby deposited on the film-forming surface of the substrate for forming a film thereon.

When the material of the EL thin-film element is sublimated and evaporated within the crucible to be discharged therefrom, the volume is reduced, gradually, of the material of the EL thin-film element remaining within the crucible. Then, since the surface area thereof is also reduced within the crucible, the volume of the sublimation of the material of the EL thin-film element is also reduced, gradually, within the crucible. Accordingly, for the purpose of maintaining the volume of the molecular supply discharged from the molecular supply source for use in the deposition of the thin-films, it is necessary to make a larger opening of the needle valve, i.e., the ratio of the cross-section of the flow passage to that when the valve is fully opened, thereby to maintain the volume of the molecular supply discharged from the molecular supply source for use in the deposition of thin-films.

However, with the adjustment made in the volume of the molecular supply by means of the needle valve, it is finite or has a limit, i.e., when the needle valve is opened fully, then it is impossible to increase the volume of the molecular supply much more than that.

In the Patent Document 2 mentioned below, there are disclosed two (2) controller means, as the adjustment means for adjusting the volume of the molecular supply. One of them is an adjustment means for adjusting the volume of the molecular supply by means of the valve, as was mentioned above. The other one is a controller means depending on the temperature at which the crucible is heated up by means of the heater. However, the latter controller means, depending on the temperature at which the crucible is heated up by means of the heater, is not suitable for adjusting the volume of the molecular supply with any accuracy because the control of the controller is direct and has a time delay.

(Patent Document 1) Japanese Patent Laying-Open No. 2003-95787 (2003); and (Patent Document 2) Japanese Patent Laying-Open No. Hei 6-80496 (1994).

BRIEF SUMMARY OF THE INVENTION

According to the present invention, which is accomplished by taking the drawbacks of the conventional molecule supply source for use in thin-film deposition and the method for controlling the molecule supply thereof into consideration, an object thereof is to provide a molecule supply source for use in thin-film deposition and also a method for controlling the amount of molecule supply, for enabling the adjustment of the volume of the molecule supply to be constant per hour by means of the needle valve, irrespective of a decrease in the remaining volume of the material for forming the thin-film elements within the crucible through the discharge of molecules from the molecule supply source for use in thin-film deposition.

Thus, according to the present invention, there is provided a molecule beam source for use in accumulating a thin-film and evaporating a material of a thin-film element, comprising: a crucible for heating the material of the thin-film element; a heater for heating said crucible; a molecule discharge passage for discharging molecules of the material of the thin-film element generated within said crucible towards a film-forming surface; a vacuum container having a hermetically sealed structure for receiving said crucible, said heater and said molecule discharge passage therein; a valve for adjusting the volume of the molecular beam discharged, positioned at said molecule discharge passage; a detection means for detecting the volume of the molecular beam discharged towards said film-forming surface; a controller means for adjusting the opening of a valve by a valve driving means through feedback information relating to the volume of the molecular beam detected by said detection means; a heating electric power source for supplying electric power for use in heating said heater; and a control means for adjusting the electric power to be supplied to said heating electric power source depending on said information relating to the volume of the molecular beam and valve opening information.

Also, according to the present invention, there is provided a method for controlling the volume of a molecular beam within a molecule beam source used in accumulating a thin-film by evaporating a material of the thin-film element, comprising the following steps of: adjusting the electric power to the electric power source for heating said crucible if the valve opening necessary for obtaining a predetermined volume of the molecular beam is equal to a predetermined reference value or larger than that, when evaporating an organic material upon a substrate, continuously, and thereby controlling the valve opening to fall within a range.

With the molecule beam source for use of accumulating the thin-film and the method for controlling the volume of the molecular beam with the use thereof, according to the present invention, as was mentioned above, while basing the control through the control means of the volume of the molecular beam, by means of the valve enabling accurate control of the volume of the molecular beam to be discharged, the volume of evaporation within the crucible per hour is maintained by increasing the temperature of the heater, when the material remaining within the crucible is consumed and becomes smaller in the volume thereof, thereby enabling the maintaining of the discharge volume of the molecular beam at a constant level.

With this, even when consuming the material of the thin-film element within the crucible, i.e., the volume of the same is decreased gradually, it is possible to maintain the amount of the volume of the molecular beam to be discharged as desired, within a controllable range with the use of the valve. Thus, up to the time when the remainder of the material of the thin-film element within the crucible comes down to be very small, it is always possible to maintain the volume of the molecular beam discharged at a constant value. Also, as was mentioned above, with the control of the volume of the molecular beam through the adjustment of the heater temperature, it is impossible to obtain an accurate control due to the time delay, etc. However, applying this in combination with the adjustment of the opening of the valve, it is possible to obtain the accurate control of the volume of the molecular beam.

As was explained above, according to the present invention, with the molecule beam source for use in accumulating the thin-film and the method for controlling the volume of a molecular beam with the use thereof, as was mentioned above, it is possible to achieve the control of maintaining the volume of the molecular beam discharged at a constant value up to the end, even if the material remaining within the crucible is consumed and thereby becomes small in the volume thereof, gradually. Furthermore, by applying the adjustment of the opening of the valve in combination with the adjustments of the needle valve and the heater temperature, it is possible to control the volume of the molecular beam, accurately.

BRIEF DESCRIPTION OF THE SEVERAL VIEWS OF DRAWINGS

Those and other objects, features and advantages of the present invention will become more readily apparent from the following detailed description when taken in conjunction with the accompanying drawings, wherein.

Figure 2:
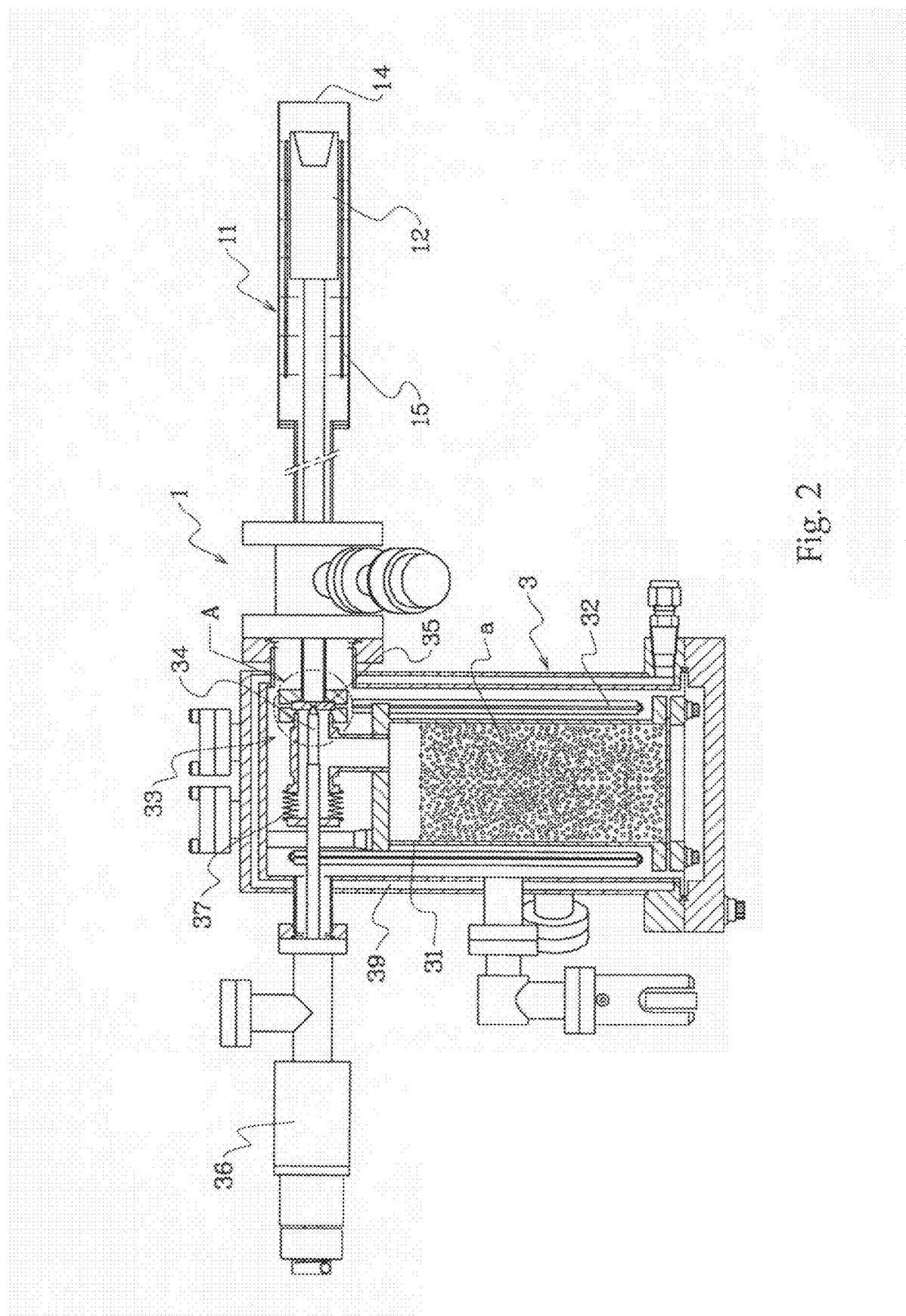
FIG. 2 is a vertical cross-section view showing one of the molecular beam source cells, according to the same embodiment mentioned above.
Figure 3:
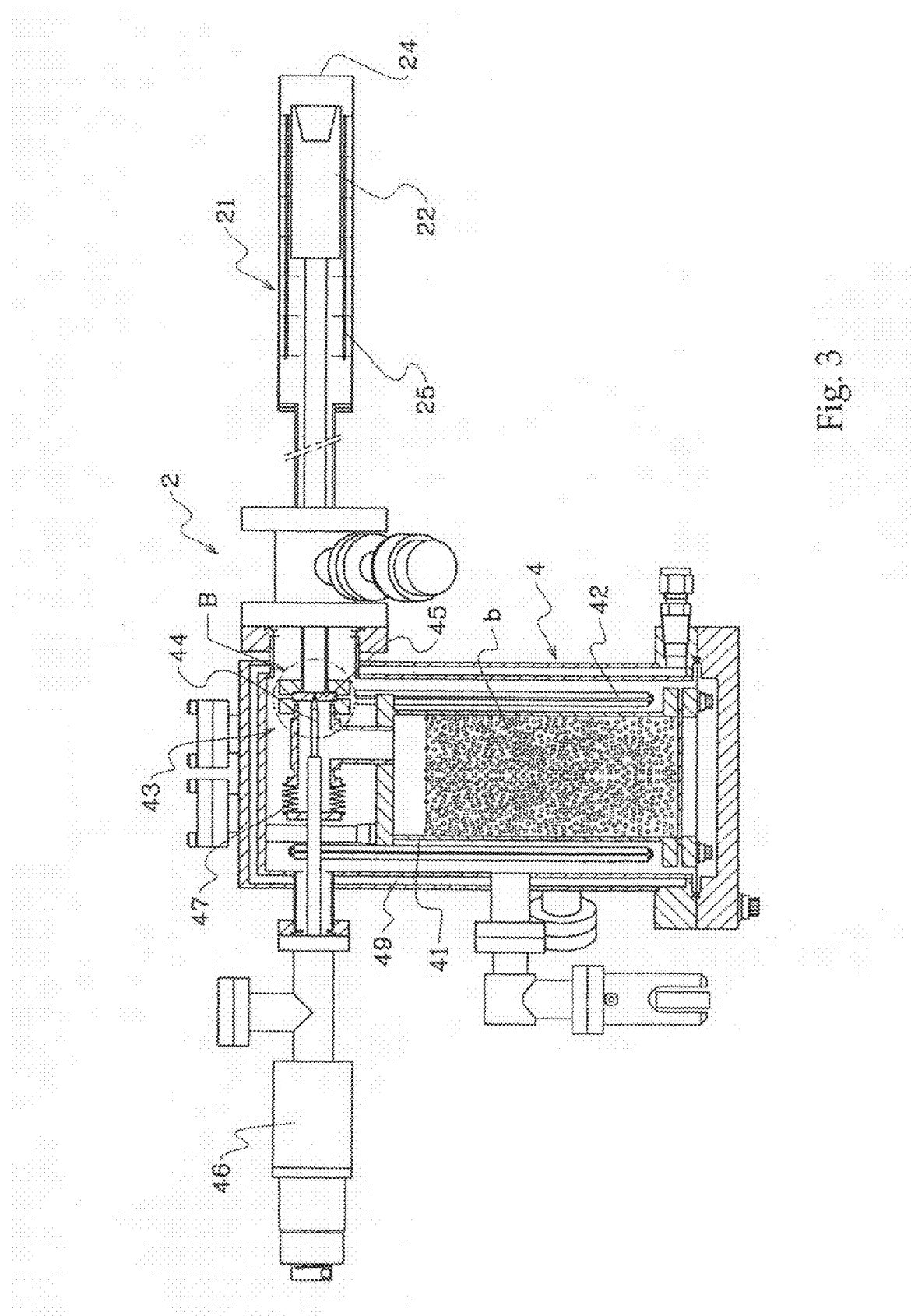
FIG. 3 is also a vertical cross-section view for showing the other molecular beam source cell, according to the same embodiment mentioned above.
Figure 4:
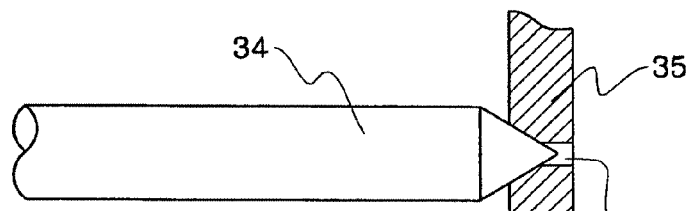
Figure 4:
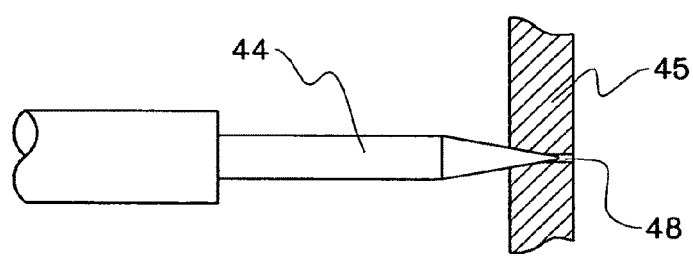
Figure 5:
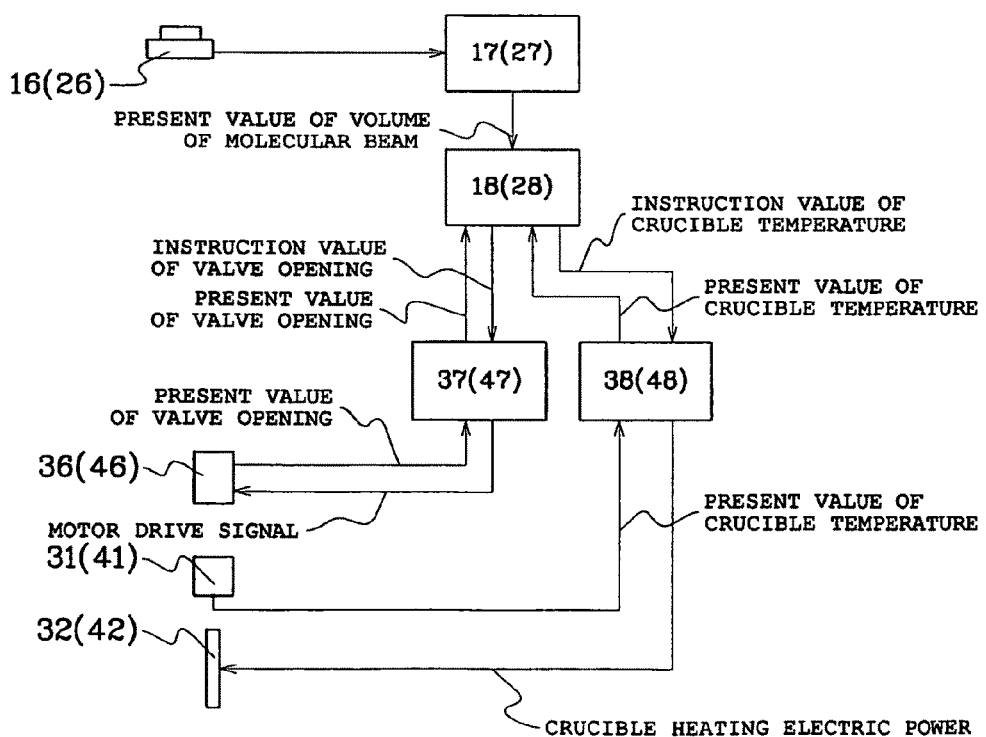

FIGS. 4(*a*) and 4(*b*) are enlarged cross-section views for showing an "A" portion and a "B" portion in FIGS. 2 and 3, respectively;

FIG. 5 is a block diagram for showing an example of controls for valves of the molecular beam source cells and an electric power source of a heater, according to the embodiment mentioned above; and FIG. 6 is a time diagram for showing an example of the controls for the valves of the molecular beam source cells and the electric power source of the heater, according to the embodiment mentioned above.

DETAILED DESCRIPTION OF THE INVENTION

According to the present invention, the molecular beam source for use in thin-film deposition or accumulation is built with molecular beam source cells, each having a valve provided between a crucible and a vacuum chamber, a detector provided within the vacuum chamber for detecting an amount or volume of molecular beams discharged, a valve-driving means for controlling the needle valves of the molecular beam source cells on the basis of a signal from that detector, and a circuit for controlling the electric power for heating the crucible on the basis of a valve position signal.

Hereinafter, embodiments according to the present invention will be fully explained by referring to the attached drawings.

Figure 1:
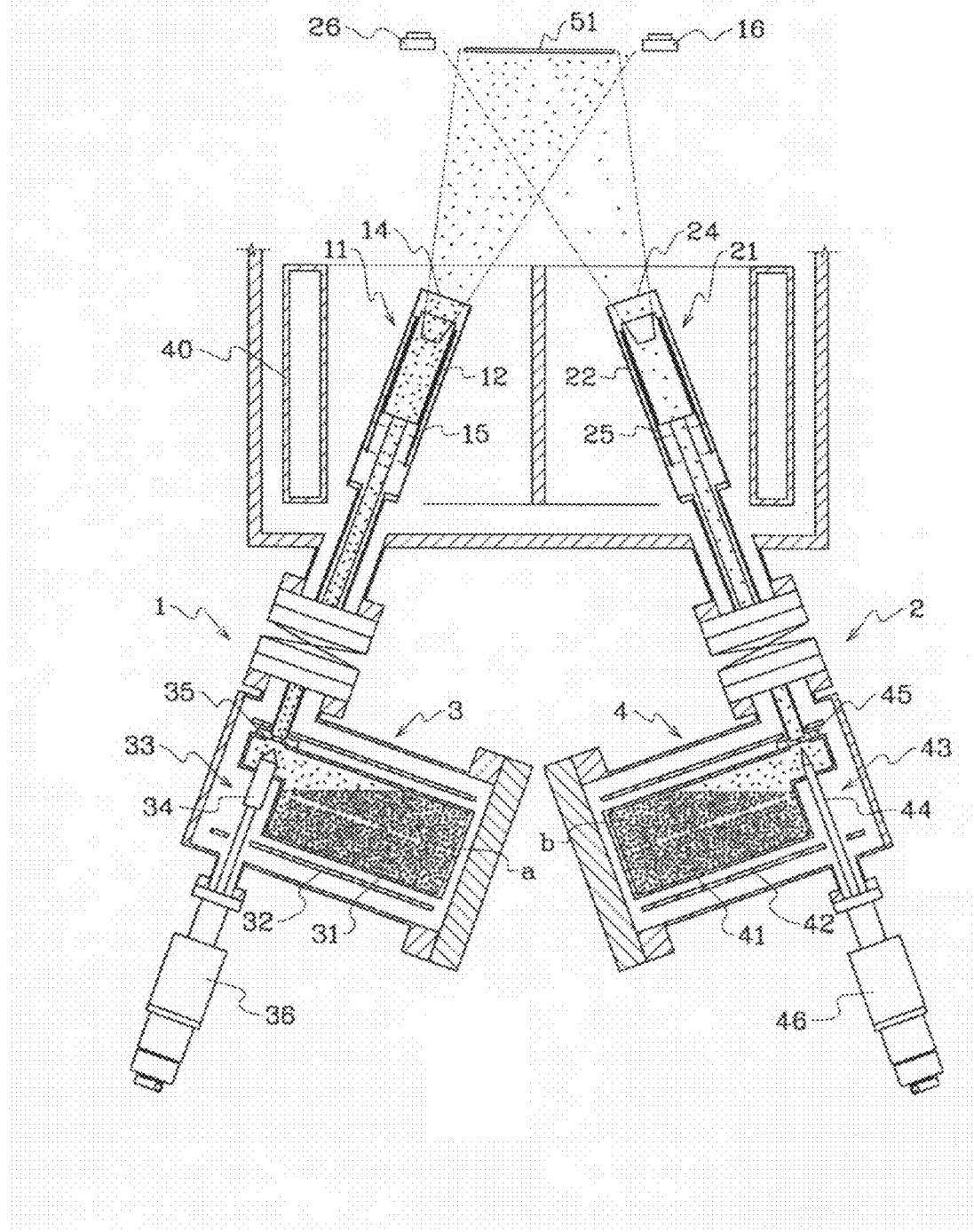
FIG. 1 is a vertical cross-section view showing an attachment portion of a vacuum chamber, having two (2) molecular beam source cells attached thereon, for using them at the same time, according to an embodiment of the present invention.

FIG. 1 shows an example of a complex molecular beam source cell, combining a first molecular beam source cell 1 for evaporating a main component, i.e. a thin-film element-forming material "a", such as a material for forming a thin-film on a substrate 51, and a second molecular beam source cell 2 for evaporating a sub-component, i.e., a thin-film element-forming material "b", such as a dopant, etc.

Each of those molecular beam source cells 1 and 2 comprises a material-receiving portion 3 or 4, having a crucible 31 or 41 for receiving the thin-film element-forming material "a" or "b" therein and a heater 32 or 42 for sublimating or evaporating the thin-film element-forming material "a" or "b", a valve 33 or 43 to be opened/closed, so as to leak or stop the molecules of the thin-film element-forming material "a" or "b", which is discharged from the material-receiving portion 3 or 4, and a molecule radiation portion 11 or 21, for discharging the molecular beam of the thin-film element-forming material "a" or "b" transmitted through the valve 33 or 43, towards the substrate 51, through re-heating it by means of a heater 15 or 24. This molecule radiation portion 11 or 21 is enclosed by a shroud 40, which is cooled with liquid nitrogen, etc. However, though not shown in the figure, the temperatures of the crucibles are measured by a temperature measurement means, respectively, such as, a thermo-couple or the like, for example, a measuring point of which is provided at a bottom portion thereof.

On the side of a substrate 51 having a film-forming surface to be deposited with a thin film thereof, upon receipt of the molecular beams of the thin-film element-forming materials "a" and "b", which are discharged from those molecular beam source cells 1 and 2, there are provided film-thickness meters 16 and 26, respectively, for detecting the volume of the molecular beams, which are discharged towards that film-forming surface. The film-thickness meter 16 is a detection means for detecting the volume of the molecular beam of the thin-film element-forming material "a" discharged from the molecular beam source cell 1, while the film-thickness meter 26 is a detection means for detecting the volume of the molecular beam of the thin-film element-forming material "b" discharged from the molecular beam source cell 2.

The molecules of the thin-film element-forming materials "a" and "b", being discharged from molecule discharge openings 14 and 24 of the molecular beam cells 1 and 2, are directed onto the substrate 51, which is positioned opposite thereto, to be evaporated thereon. In this instance, a portion of each of the materials is directed towards the film-thickness meter 16 or 26, and then the volume can be detected of the molecular beam of the thin-film element-forming material "a" or "b", which is captured by the film-thickness meter 16 or 26. Since there is a certain relationship between the volume of the molecular beam detected and the volume of material depositing onto the substrate, the volume of the thin-film element-forming material "a" or "b" can be determined, which is deposited on the substrate.

FIG. 2 shows the first molecular beam source cell 1, which sublimates or evaporates the main component, i.e., the thin-film element-forming material "a", thereby irradiating it. The material-receiving portion 3 of this molecular beam source cell 1 has the cylindrical container-like crucible 31, which is made of a high heat conduction material of a metal, such as, SUS, etc., and within the crucible 31 is put the thin-film element-forming material "a".

Surrounding the crucible 31 is provided the heater 32 and, further, a shroud 39 is provided surrounding an outside thereof, which is cooled through liquid nitrogen, etc. A heat value of the heater 32 is controlled through the temperature measuring means (not shown in the figure), such as, the thermocouple or the like, which is provided on the crucible 31, and the thin-film element-forming material "a" is heated within the crucible 31, therefore, the thin-film element-forming material "a" is sublimated or evaporated within the crucible 31, thereby generating the molecules thereof. Also, by stopping the heat-generation of the heater 32 while cooling an inside of the crucible 31 with the aid of the shroud 39, the thin-film element-forming material "a" is cooled down, thereby stopping the sublimation or evaporation of the thin-film element-forming material.

On the side of the crucible 31, from which the molecules of the thin-film element-forming material are discharged, is provided the valve 33. This valve 33 is a so-called needle valve having a sharp needle 34 and a valve seat 35 for forming a molecule passage opening, which is closed (or shut off) in the flow passage thereof or narrowed in the cross-section area thereof through insertion of a tip of the needle 34. The needle 34 mentioned above is moved in the direction of a central axis thereof, with the aid of a linear movement that is introduced through a bellows 37 from a servomotor 36, which is provided as an actuator.

FIG. 4(*a*) is an enlarged view of the "A" portion shown in FIG. 2, wherein the tip of the needle 34 is inserted into the molecule passage opening 38 of the valve sheet 35 through the linear movement thereof mentioned above, or it is separated from the molecule passage opening 38, thereby to open the molecule passage opening 38. This FIG. 4(*a*) shows the condition where the tip of the needle 34 is inserted into the molecule passage opening 38 of the valve seat 35, so as to block the molecule passage opening 38, i.e., the condition where the valve 33 is closed or shut off.

As is shown in FIG. 2, at the end of a direction passing through the molecule passage opening of the valve seat 35, which can be opened/closed by means of the valve 33, there is provided the molecule radiation portion 11. This molecule radiation portion 11 has a cylinder-like molecule heater chamber 12, and surrounding this molecule heater chamber 12 is provided the heater 15. Molecules of the thin-film element-forming material, leaking from the side of the valve 33 mentioned above and reaching the molecule radiation portion 11 are heated again (i.e., re-heated), up to the desired temperature within this molecule heater chamber 12, and are irradiated from the molecule discharge opening 14 towards the substrate.

On the other hand, FIG. 3 shows the second molecular beam source cell 2, which sublimates or evaporates the subcomponent, i.e., the thin-film element-forming material "b", thereby irradiating it. The structures of this second molecular beam source cell 2 are basically the same as that of the first molecular beam source cell 1 mentioned above.

Thus, the material-receiving portion 4 of this molecular beam source cell 2 has the cylindrical container-like crucible 41, which is also made of the high heat conduction material of a metal, such as, SUS, etc., and within the crucible 41 is put the thin-film element-forming material "b".

Surrounding the crucible 41 is provided the heater 42, and further a shroud 49 is provided surrounding an outside thereof, which is cooled through the liquid nitrogen, etc. The structures and functions of the heater 42 and the shroud 49 are completely the same as those of the heater 32 and the shroud 39, which are mentioned by referring to FIG. 2.

On the side of the crucible 41, from which the molecules of the thin-film element-forming material are discharged, is provided the valve 43. This valve 43 is also a so-called needle valve, having a sharp needle 44 and a valve seat 45 for forming a molecule passage opening, which is closed (or shut off) in the flow passage thereof or narrowed in the cross-section area thereof through the insertion of a tip of the needle 44. The needle 44 mentioned above is moved in the direction of a central axis thereof with the aid of a linear movement that is introduced through a bellows 47 from a servomotor 46, which is provided as an actuator.

FIG. 4(b) is an enlarged view of the "B" portion shown in FIG. 3, wherein the tip of the needle 44 is inserted into the molecule passage opening 48 of the valve seat 45 through the linear movement thereof mentioned above, or it is separated from the molecule passage opening 48 to thereby open the molecule passage opening 48. This molecular beam source cell 2 is provided for discharging the sub-component or material, such as the dopant, etc. and, for this reason, it is designed such that an opening diameter of the valve seat 45 and a taper-angle at the tip of the needle and the maximum opening area of the valve 43, as well, are smaller than those of the molecular beam source cell mentioned above for discharging the main component or material. Thus, it is possible to accurately control the volume of the molecular beam.

As is shown in FIG. 3, at the end of a direction passing through the molecule passage opening of the valve seat 45, which can be opened/closed by means of the valve 43, there is provided the molecule radiation portion 21. This molecule radiation portion 21 has a cylinder-like molecule heater chamber 22, and surrounding this molecule heater chamber 22 is provided the heater 25. Molecules of the thin-film element-forming material, leaking from the side of the valve 43 mentioned above and reaching the molecule radiation portion 21 are heated again (i.e., re-heated), up to the desired temperature within this molecule heater chamber 22, and are irradiated from the molecule discharge openings 24 towards the substrate.

According to the present invention, controls are made upon the servomotors 36 and 46, which adjust the opening of the valves 33 and 43 through driving them. At the same time, control is also made on an electric power source, which supplies electric power to the heaters 32 and 42 for heating the crucibles 31 and 41. Those controls are conducted with a programming control, through feed-back of the volumes of the molecular beams discharged from the molecular beam source cells 1 and 2, which are detected by the film-thickness meters 16 and 26 and, also, information relating to the openings of the valves 33 and 43, which are opened by the servomotors 36 and 46.

FIG. 5 is a view for showing a flow sheet of that control system. Basically, the same control system is applied to both of the molecular beam source cells 1 and 2 and the elements of the control system for the molecular beam source cell 2 are indicated by the reference numerals in parentheses.

As is shown in this FIG. 5, signals are generated from the film-thickness meters 16 and 26, depending upon the volumes of the molecular beams discharged from the molecular beam source cells 1 and 2, and those signals are transmitted from processors 17 and 27 to valve controllers 37 and 47 and heater controllers 38 and 48, through molecular beam controllers 18 and 28, respectively.

In an initial period of the operation thereof, the molecular beam controller 18 or 28 transmits an instruction value relating to temperature of the crucible 31 or 41, which is determined in advance, to the heater controller 38 or 48 serving also as an electric power source thereof and, at the same time, calculates an opening instruction value for the valve from a preset target value of the volume of the molecular beam and information relating to the present value of the volume of the molecular beam, which is transmitted from the film-thickness meter 16 or 26 through the processor 17 or 27, so as to send it to the valve controller 37 or 47.

The valve controller 37 or 47 transmits a driving signal to the servomotor 36 or 46 of the valve 33 or 43 on the basis of the opening instruction value, which is transmitted from the processor 17 or 27, and thereby adjusts the opening of the valve 33 or 43, i.e., the ratio M of the cross-sectional area of the flow passage of the valve 33 or 34 to that when it is fully opened. Together with this, it also transmits the opening of the valve 33 or 34 to the molecular beam controller 18 or 28.

As a matter of course, when the volume of the molecular beam, which is detected by the film-thickness meter 16 or 26, does not reach a target thereof, the molecular beam controller 18 or 28 makes an adjustment to the valve opening instruction value, in such a manner or direction that the opening of the valve 33 or 34 becomes larger, while when the volume of the molecular beam exceeds the target, the valve opening instruction value is adjusted so that the opening of the valve 33 or 34 becomes smaller, in the direction thereof.

On the other hand, the heater controller 38 or 48 controls the electric power to be supplied to the heater 32 or 42, so that the temperature of the crucible 31 or 41 measured by the thermocouple, etc., maintains the instruction value, which is provided from the molecular beam controller 18 or 28. Herein, when the present value of the opening of the valve 33 or 43 exceeds an upper limit value thereof, which is determined in advance, the molecular beam controller 18 or 28 transmits the instruction value signal to the heater controller 38 or 48, so as to increase the temperature of the crucible 31 or 41. When the temperature of the crucible 31 or 41 increases, since the vapor pressure of the thin-film element-forming material "a" or "b" within the crucible 31 or 41 increases, then the volume of molecular beam increases, even at the same opening of that valve. For this reason, the molecular beam controller 18 or 28 decreases the valve opening instruction value transmitted to the valve controller 37 or 47, trying to maintain the volume of the molecular beam to be constant and, therefore, as a result thereof, the present value of the opening of the valve 33 or 43 is so controlled that it comes to be lower than the upper limit value. Also, a region of increasing temperature is controlled so that the temperature can rise up to a temperature increasing value, which is determined in advance, or the opening of the valve 33 or 43 is controlled so that it comes to be lower than that, which is determined in advance.

Contrarily, when the present value of opening of the valve 33 or 43 is lower than a lower limit value thereof, which is determined in advance, the molecular beam controller 18 or 28 transmits an instruction value signal to the heater controller 38 or 48, so as to decrease the temperature of the crucible 31 or 41, thereby lowering the temperature of the crucible 31 or 41.

When an indicated value of opening of the valve 33 or 43 of the servomotor 36 or 46 lies between the upper limit value and the lower limit value, which are determined in advance, no change is made to the instructions to the heater controller 38 or 48.

Figure 6:
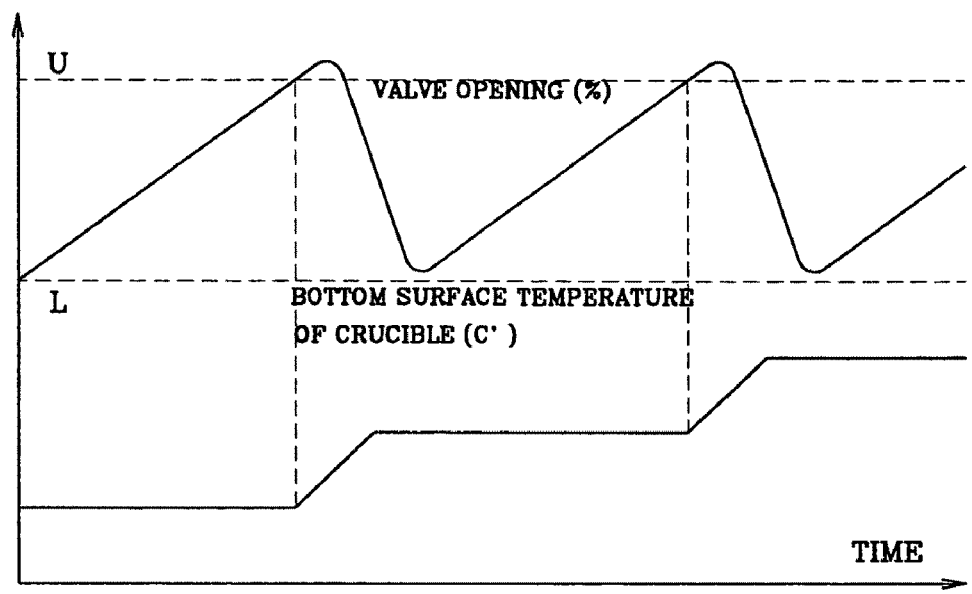

FIG. 6 shows the time diagram of the controls mentioned above. When decreasing in the amount or volume of the thin-film element-forming material "a" or "b" within the crucible 31 or 41, accompanying the consumption thereof, then the value of the evaporation of the thin-film element-forming material "a" or "b" within the crucible 31 or 41 is decreased, gradually. The molecular beam, which is discharged from the molecule discharge opening 14 or 24 of the molecular beam source cell 1 or 2, is controlled to be constant in the volume thereof, responding to this by means of the molecular beam controller 18 or 28, therefore, the opening of the valve 33 or 43 becomes larger with the elapse of time. When the opening of the valve 33 or 43 exceeds the upper limit value "U", which is determined in advance, a temperature increase instruction is given from the molecular beam controller 18 or 28 to the heater controller 38 or 48, so that the crucible 31 or 41 increases the temperature thereof. Accompanying this, the volume of the molecular beam, which is detected by the film-thickness meter 16 or 26 per hour, increases in the tendency thereof. For maintaining the volume of the molecular beam, which is discharged from the molecule discharge opening 14 or 24 of the molecular beam source cell 1 or 2, to be constant, responding to this, the servomotor 36 or 46 of the valve 33 or 43 is driven by means of the valve controller 37 or 47, i.e., the opening of the valve 33 or 43 is controlled to decrease. Thereafter, when the volume of the molecular beam, which is detected by the film-thickness meter 16 or 26 per hour, changes the tendency thereof to increase, then for maintaining the volume of the molecular beam discharged from the molecule discharge opening 14 or 24 of the molecular beam source cell 1 or 2 constant, the opening of the valve 33 or 43 is controlled to be larger by the valve controller 37 or 47, again. In this manner, the volume of the molecular beam, which is detected by the film-thickness meter 16 or 26 per hour, is controlled to be constant, i.e. maintaining a stable value thereof.

However, when increasing the temperature of the crucible 31 or 41 in a step-like manner by a unit or width of temperature increase which is determined in advance, that unit or width of temperature increase must be determined in advance through experimentation and/or calculation at the temperature that the volume of the molecular beam, which is detected by the film-thickness meter 16 or 26 per hour, changes the tendency thereof to decrease under the condition where the opening of the valve 33 or 43 does not reach the lower limit value "L", and then there is the necessity of increasing the valve opening thereafter.

Although the embodiment mentioned above shows the example of obtaining the film forming through the discharge of the molecular beams from the two (2) molecular beam source cells towards the substrate 51, however, it is of course that the present invention can also be applied to a case where the film forming is obtained through the discharge of the molecular beam from a single molecular beam source cell towards the substrate 51, or into a case where the film forming is obtained through discharge of the molecular beams from three (3) or more of the molecular beam source cells towards the substrate 51, and so on.

The present invention may be embodied in other specific forms without departing from the spirit, essential features or characteristics thereof. The present embodiment(s) is/are therefore to be considered in all respects as illustrative and not restrictive, the scope of the invention being indicated by the appended claims rather than by the forgoing description and the range of equivalency of the claims are therefore to be embraced therein.

What is claimed is:

1. A molecular beam source for evaporating a material of a thin-film element and depositing the thin-film element on a film-forming surface, comprising:
   a crucible for containing the material of the thin-film element;
   a heater for heating the crucible containing the material of the thin-film element and generating molecules of the material of the thin-film element;
   a molecule discharge passage for discharging the molecules of the material of the thin-film element generated in the crucible towards the film-forming surface;
   a vacuum container having a hermetically sealed structure for receiving said crucible, said heater and said molecule discharge passage therein;
   a valve for adjusting the volume of a molecular beam discharged from the molecule discharge passage;
   a detection means for detecting the volume of the molecular beam discharged towards said film-forming surface;
   a first controller programmed to adjust the opening of the valve based on feed-back information of the detected volume of the molecules of the thin-film element material;
   an electric power source for supplying electric power to the heater; and
   a second controller programmed to adjust the electric power supplied to the heater based on the feedback information of the detected volume of the molecules of the thin-film element material and valve opening information and adjusting the electric power supplied to the heater when a value corresponding to the opening of the valve exceeds a predetermined upper limit or is less than a predetermined lower limit.

2. The molecular beam surface of claim 1, additionally comprising:
   a second crucible for containing a material of a second thin-film element;
   a second heater for heating the second crucible containing the material of the second thin-film element and generating molecules of the material of the second thin-film element;
   a second molecule discharge passage for discharging the molecules of the material of the second thin-film element generated in the second crucible towards the film-forming surface;
   a second valve for adjusting the volume of a molecular beam discharged from the second molecule discharge passage;
   a second detection means for detecting the volume of the molecular beam discharged from the second molecule discharge passage towards said film-forming surface;

a third controller programmed to adjust the opening of the second valve based on feed-back information of the detected volume of the molecules of the second thin-film element material;

a second electric power source for supplying electric power to the second heater; and a fourth controller programmed to adjust the electric power supplied to the second heater based on the feedback information of the detected volume of the molecules of the second thin-film element material and second valve opening information and adjusting the electric power supplied to the second heater when a value corresponding to the opening of the second valve exceeds a predetermined upper limit or is less than a predetermined lower limit.

* * * * *